United States Patent
Farias et al.

(10) Patent No.: US 7,489,916 B1
(45) Date of Patent: Feb. 10, 2009

(54) DIRECT DOWN-CONVERSION MIXER ARCHITECTURE

(75) Inventors: Michael Farias, San Diego, CA (US); John Groe, Poway, CA (US); Damian Costa, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 718 days.

(21) Appl. No.: 10/454,761

(22) Filed: Jun. 4, 2003

Related U.S. Application Data

(60) Provisional application No. 60/386,003, filed on Jun. 4, 2002.

(51) Int. Cl.
*H04B 1/26* (2006.01)
*H04B 15/00* (2006.01)

(52) U.S. Cl. ............ 455/315; 455/189.1; 455/323; 455/255

(58) Field of Classification Search .......... 455/334, 455/313, 189.1, 323, 333, 266, 339, 34.1, 455/550.1, 130, 141, 164.2, 219, 232.1, 234.1, 455/260, 269; 375/322, 259, 285
See application file for complete search history.

(56) References Cited

U.S. PATENT DOCUMENTS

| | | | |
|---|---|---|---|
| 448,539 | A | 3/1891 | Morris |
| 599,071 | A | 2/1898 | Barr |
| 4,263,560 | A | 4/1981 | Ricker |
| 4,430,627 | A | 2/1984 | Machida |
| 4,769,588 | A | 9/1988 | Panther |
| 4,816,772 | A | 3/1989 | Klotz |
| 4,926,135 | A | 5/1990 | Voorman |
| 4,965,531 | A | 10/1990 | Riley |
| 4,994,768 | A | 2/1991 | Shepherd et al. |
| 5,006,818 | A | 4/1991 | Koyama et al. |
| 5,015,968 | A | 5/1991 | Podell et al. |
| 5,030,923 | A | 7/1991 | Arai |
| 5,289,136 | A | 2/1994 | DeVeirman et al. |
| 5,331,292 | A | 7/1994 | Worden et al. |
| 5,399,990 | A | 3/1995 | Miyake |
| 5,491,450 | A | 2/1996 | Helms et al. |
| 5,508,660 | A | 4/1996 | Gersbach et al. |
| 5,548,594 | A | 8/1996 | Nakamura |
| 5,561,385 | A | 10/1996 | Choi |
| 5,581,216 | A | 12/1996 | Ruetz |
| 5,631,587 | A | 5/1997 | Co et al. |
| 5,648,744 | A | 7/1997 | Prakash et al. |
| 5,677,646 | A | 10/1997 | Entrikin |
| 5,739,730 | A | 4/1998 | Rotzoll |
| 5,767,748 | A | 6/1998 | Nakao |
| 5,818,303 | A | 10/1998 | Oishi et al. |
| 5,834,987 | A | 11/1998 | Dent |
| 5,862,465 | A | 1/1999 | Ou |

(Continued)

*Primary Examiner*—John J Lee
(74) *Attorney, Agent, or Firm*—Daniel Tagliaferri, Esq.; Cooley Godward Kronish LLP

(57) ABSTRACT

Direct down-conversion mixer. A direct down-conversion mixer is provided. The mixer comprises an LO switching pair coupled to receive an RF input signal and produce a down converted output signal. The mixer also comprises an integrator coupled to receive the output signal and produce an integrator output signal. The mixer also comprises a control circuit coupled to receive an input voltage and the integrator output signal to produce a control signal that is coupled to the LO switching pair.

13 Claims, 8 Drawing Sheets

U.S. PATENT DOCUMENTS

| | | |
|---|---|---|
| 5,878,101 A | 3/1999 | Aisaka |
| 5,880,631 A | 3/1999 | Sahota |
| 5,939,922 A | 8/1999 | Umeda |
| 5,945,855 A | 8/1999 | Momtaz |
| 5,949,286 A | 9/1999 | Jones |
| 5,990,740 A | 11/1999 | Groe |
| 5,994,959 A | 11/1999 | Ainsworth |
| 5,999,056 A | 12/1999 | Fong |
| 6,011,437 A | 1/2000 | Sutardja et al. |
| 6,018,651 A | 1/2000 | Bruckert et al. |
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,234,387 B1 | 5/2001 | Cuthbert et al. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 12/2001 | Saito |
| 6,370,372 B1 * | 4/2002 | Molnar et al. ............... 455/323 |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,549,078 B1 | 4/2003 | Sridharan et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,683,509 B2 | 1/2004 | Albon et al. |
| 6,693,977 B2 * | 2/2004 | Katayama et al. ........... 375/322 |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 * | 6/2004 | Burns et al. .................. 375/340 |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,917,719 B2 | 7/2005 | Chadwick |
| 6,940,356 B2 | 9/2005 | McDonald, II et al. |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 | 1/2006 | Zheng et al. |
| 7,062,248 B2 * | 6/2006 | Kuiri .......................... 455/334 |
| 7,065,334 B1 | 6/2006 | Otaka et al. |
| 7,088,979 B1 * | 8/2006 | Shenoy et al. ............... 455/313 |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 | 5/2007 | Hirano et al. |
| 2002/0031191 A1 | 3/2002 | Shimizu |
| 2002/0071497 A1 | 6/2002 | Bengtsson et al. |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Ballaouar et al. |
| 2003/0197564 A1 | 10/2003 | Humphreys et al. |
| 2004/0017852 A1 | 1/2004 | Redman-White |
| 2004/0017862 A1 * | 1/2004 | Redman-White .......... 375/319 |
| 2004/0051590 A1 | 3/2004 | Perrott et al. |
| 2005/0093631 A1 | 5/2005 | Groe |
| 2005/0099232 A1 | 5/2005 | Groe et al. |

* cited by examiner

DIRECT DOWN-CONVERSION MIXER ARCHITECTURE

CROSS REFERENCE TO RELATED APPLICATIONS

This application claims the benefit of priority of a U.S. Provisional patent application entitled, "DIRECT DOWN-CONVERSION MIXER ARCHITECTURE" Ser. No. 60/386,003, filed on Jun. 4, 2002, the disclosure of which is incorporated by reference herein in its entirety for all purposes.

FIELD OF INVENTION

The present invention relates generally to down-conversion mixers and more particularly to a direct down-conversion mixer with improved second order linearity.

BACKGROUND OF THE INVENTION

A down-conversion mixer circuit translates the carrier frequency ($f_c$) of an input RF signal to a lower carrier frequency. In a direct down conversion mixer, the output occurs at baseband, with a carrier frequency equal to zero.

Mixers typically display nonlinear properties. Even order nonlinearities translate strong interfering signals directly to baseband, which is particularly problematic in direct down conversion mixers. The even order distortion masks the wanted signal and thereby lowers the overall signal to noise ratio.

Communications receivers must process very strong unwanted signals without corrupting the oftentimes very weak desired signal. In a typical radio receiver, the down conversion mixer is the first block to operate at baseband frequencies and therefore has no filtering before it to minimize the strength of unwanted signals.

It would be therefore advantageous to have a direct down conversion mixer with low even order distortion.

SUMMARY OF THE INVENTION

The present invention includes a differential feedback system that minimizes the even order distortion and DC offsets for use in a mixer circuit. For example, in one embodiment of the invention, the system includes a feedback circuit that resolves even order distortion and DC offsets by analyzing the mean value of the mixer circuit's output waveform.

In one embodiment, a direct down-conversion mixer is provided. The mixer comprises an LO switching pair coupled to receive an RF input signal and produce a down converted output signal. The mixer also comprises an integrator coupled to receive the output signal and produce an integrator output signal. The mixer also comprises a control circuit coupled to receive an input voltage and the integrator output signal to produce a control signal that is coupled to the LO switching pair.

In another embodiment, a direct down-conversion mixer is provided. The mixer comprises an LO switching pair means for receiving an RF input signal and producing a down converted output signal. The mixer also comprises an integrator means for receiving the output signal and producing an integrator output signal. The mixer also comprises a control circuit means for receiving an input voltage and the integrator output signal and producing a control signal that is coupled to the LO switching pair.

In another embodiment, a method is provided for calibrating a direct down-conversion mixer. The mixer comprising an LO switching pair coupled to receive an RF input signal and produce a down converted output signal. The mixer also comprises an integrator coupled to receive the output signal and produce an integrator output signal. The mixer also comprises a control circuit coupled to receive an input voltage and the integrator output signal to produce a control signal that is coupled to the LO switching pair. The method comprises the steps of calibrating the mixer output, calibrating a the mixer input offset, and calibrating a gain of the control circuit.

BRIEF DESCRIPTION OF DRAWINGS

The foregoing aspects and the attendant advantages of the embodiments described herein will become more readily apparent by reference to the following detailed description when taken in conjunction with the accompanying drawings wherein.

DETAILED DESCRIPTION

There exists several different signal types with mean values that approach zero; that is, the average value of the signal waveform, measured over a period of time, is nearly zero, i.e.

$$E[x(n)] = \frac{\sum x_n}{n} \quad E[x(t)] = \frac{\int x\,dt}{t}$$

Communication signals, such as the signals formed by frequency modulation and digital modulation techniques, show this property. For example, a local oscillator (LO) signal applied to a down conversion mixer shows this property.

When a modulation signal is subjected to even order distortion, its mean value is altered. Consider a modulated signal described generally by the following expression;

$$s(t)=m_I(t)\cos\omega_c t+m_Q(t)\sin\omega_c t$$

and subjected to distortion from a nonlinear circuit, modeled by the Taylor series expansion given as;

$$v_{out}=a_1 v_{in}+a_2 v_{in}^2+a_3 v_{in}^3+\ldots$$

where coefficients $a_i$ represent distortion. The resulting squared term, $a_2 v_{in}^2$, becomes $$a_2 v_{in}^2 = a_2\left[\frac{m_I^2(t)}{2}(1+\cos 2\omega_c t)+\frac{m_Q^2(t)}{2}(1+\sin 2\omega_c t)\right]$$

and shows that the message signal is translated to both baseband and two times the carrier frequency ($\omega_c$).

Figure 1:
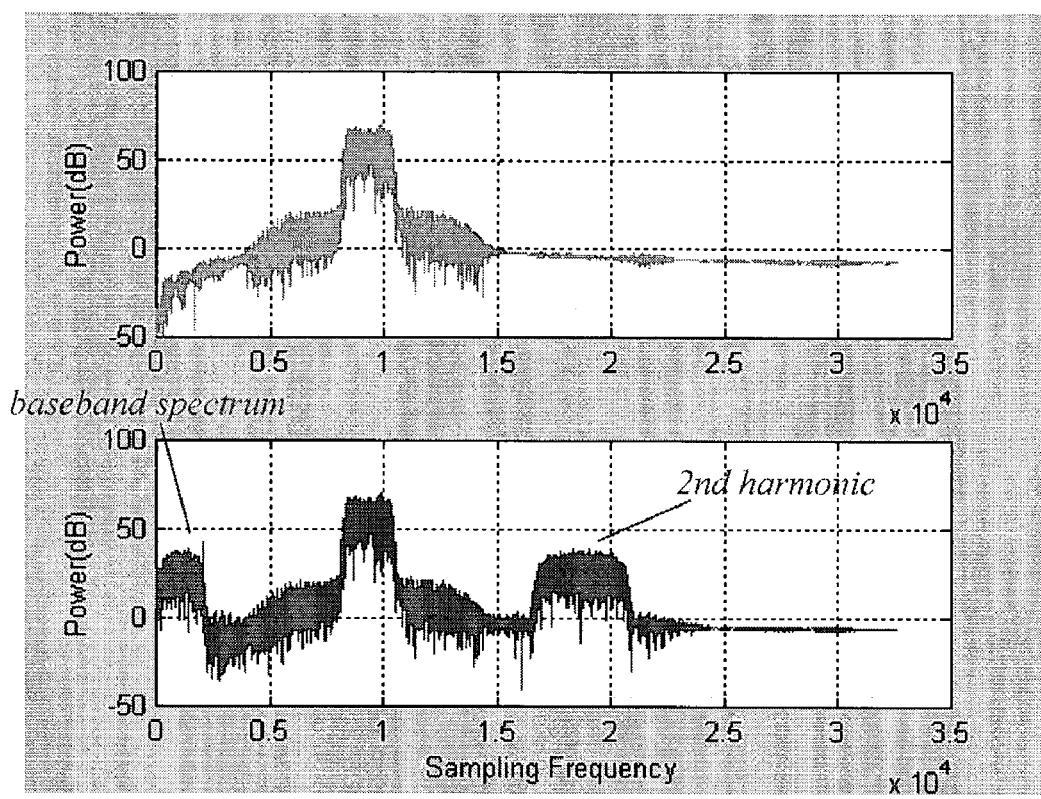
FIG. 1 illustrates the effects of even-order distortion on the power spectral density of a modulation signal, and in particular, shows a shift of the signal's power to baseband where it can be easily identified.

FIG. 1 illustrates the effects of even-order distortion on the power spectral density of a modulation signal, and in particular, illustrates a shift of the signal's power to baseband where it can be easily identified. For the special case where the message signals are constant-amplitude, the baseband signal is simply a DC offset. In other cases where the signals are amplitude modulated, the bandwidth of the baseband signal is doubled.

Figure 2:
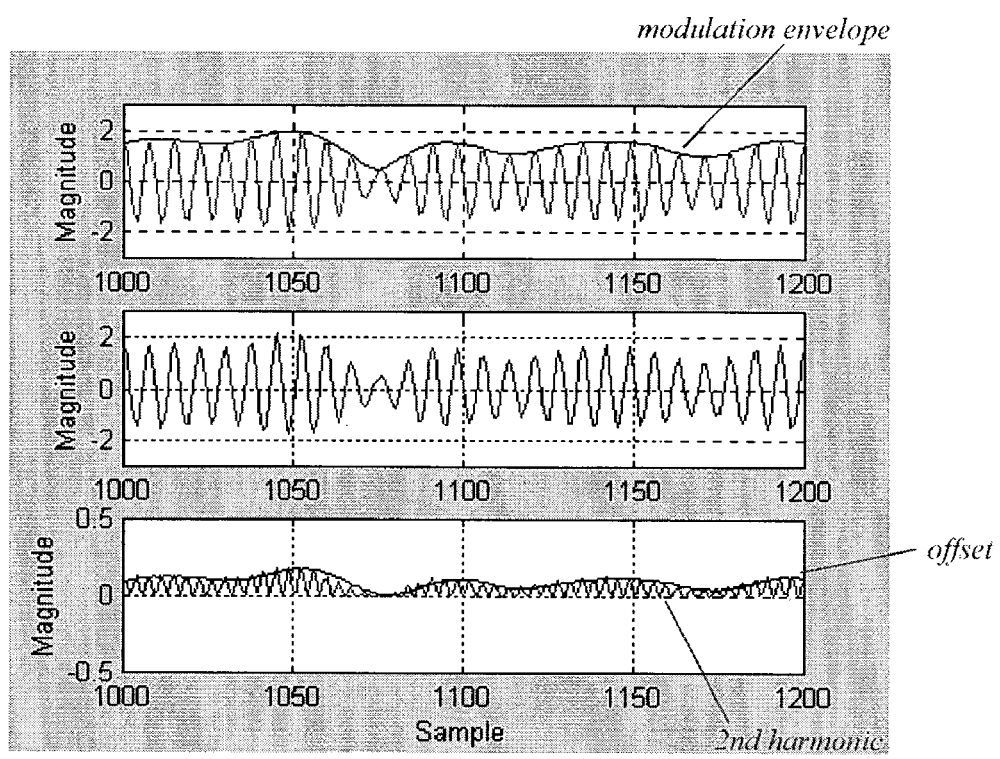
FIG. 2 illustrates an amplitude-shift in the modulation signal when subjected to even-order distortion.

FIG. 2 illustrates an amplitude-shift in a modulation signal when subjected to even-order distortion. For cases where the message signals are amplitude modulated, a squaring operation shifts the baseband signal positively as shown by the "offset" values.

Figure 3:
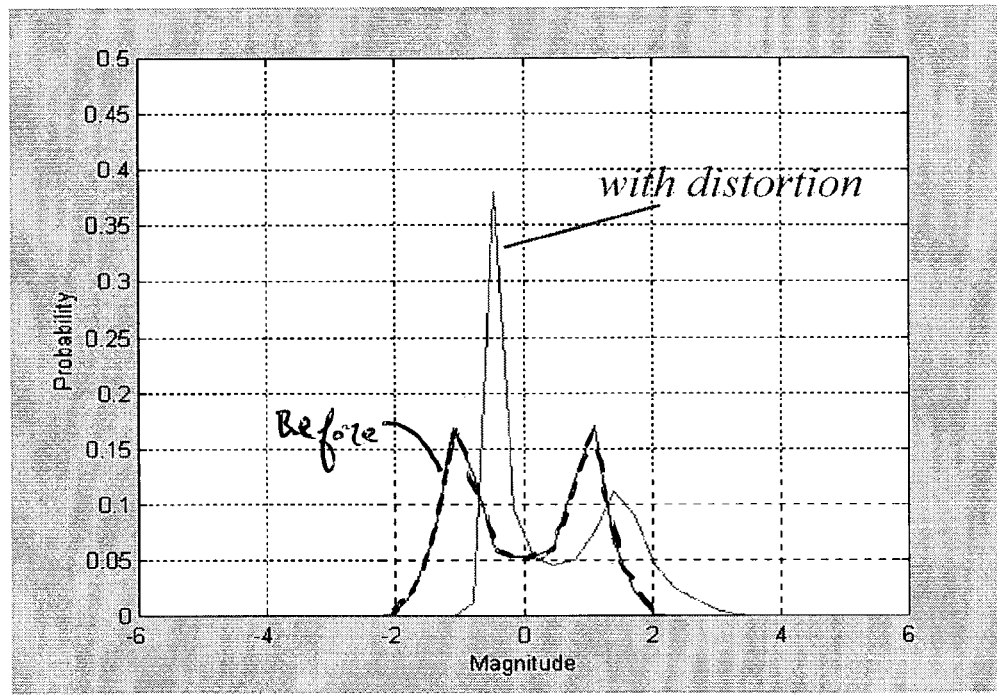
FIG. 3 illustrates probability distribution functions of a modulation signal before and after even-order distortion.

FIG. 3 illustrates probability distribution functions of a modulation signal before and after even-order distortion, thereby providing another view of the change in a signal's properties. Clearly, even order distortion alters the mean value of the signal.

Even order distortion becomes problematic when it lowers the signal-to-noise ratio (SNR) of the wanted signal. (Noise generally describes any unwanted energy including thermal, flicker (1/f) and shot noise plus distortion.) The even order distortion is straightforward to measure using the mean value of the signal, which is ideally zero. Any nonzero value indicates even order distortion or a DC offset.

Figure 4:
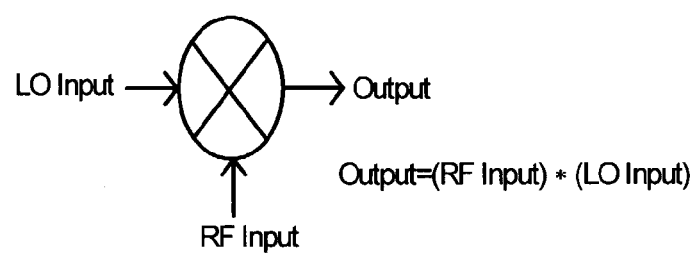
FIG. 4 shows a diagram of a mixer circuit.

FIG. 4 shows a diagram of a mixer circuit, which is generally modeled as an analog multiplier. A typical down conversion mixer translates the spectrum of an RF signal to a lower carrier frequency. Mathematically, this frequency translation is realized as;

$$\cos(\omega_{LO}t)\cdot\cos(\omega_{RF}t)=\frac{1}{2}\cos(\omega_{LO}t+\omega_{RF}t)+\frac{1}{2}\cos(\omega_{LO}t-\omega_{RF}t)$$

where $\omega_{LO}$ and $\omega_{RF}$ are the carrier frequencies of the signals applied to the LO and the RF input ports, respectively. Two frequency terms are present at the output, the upper sideband at $\omega_{LO}+\omega_{RF}$ and the lower sideband at $\omega_{LO}-\omega_{RF}$. The lower sideband is the wanted signal in a down conversion mixer. A direct down conversion mixer sets $\omega_{LO}$ equal to $\omega_{RF}$ and thereby translates $\omega_{RF}$ directly to baseband.

Figure 5:
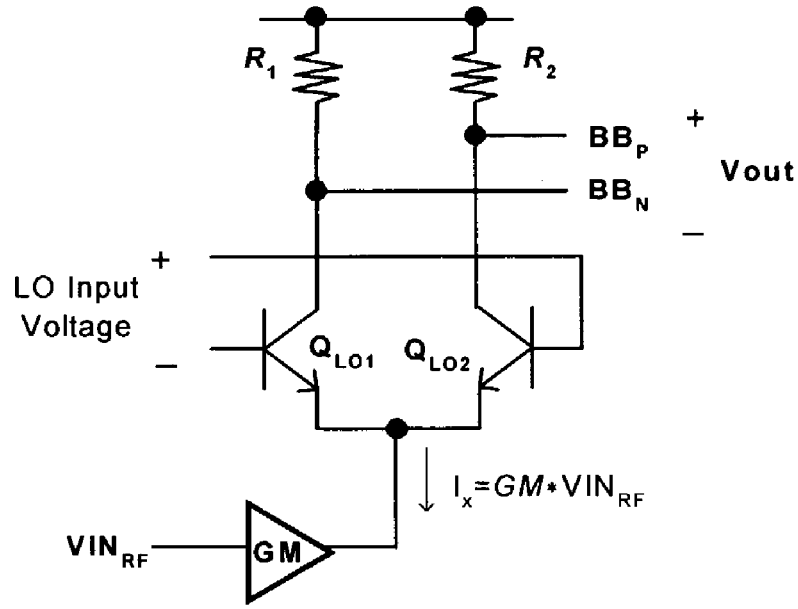
FIG. 5 shows a circuit schematic of a single balanced mixer circuit.

FIG. 5 shows a circuit diagram of a single balanced mixer. The circuit translates a modulated signal $m(t)\cdot\sin(\omega_{RF}t)$ whose frequency is centered at $\omega_{RF}$ to baseband. The transconductance amplifier (GM) converts the RF input signal to a current $I_x$, which is applied to the commutating switches, formed by $Q_{LO1}$ and $Q_{LO2}$. The lower sideband differential output voltage (Vout) is expressed as;

$$V_{out}=\alpha\cdot m(t)\cdot\cos(\omega_{RF}t-\omega_{LO}t)$$

where $\alpha$ is the conversion gain of the mixer. In the direct down conversion mixer, $\omega_{LO}=\omega_{RF}$ and $$V_{out}=\alpha\cdot m(t)$$

There are two areas in this mixer structure where even order distortion can affect overall performance, the GM transconductance stage and the LO switching pair. The transconductance stage can be represented by the nonlinear transfer function;

$$I_x=a_0+a_1 V_{RF}+a_2 V_{RF}^2+a_3 V_{RF}^3\ldots a_n V_{RF}^n$$

where $a_0$ describes the DC offset, $a_1$ describes the ideal transconductance, $a_{2n}$ models the even order distortion, and $a_{2n+1}$ models the odd order distortion. As discussed above, the even order distortion is particularly problematic for direct down conversion mixers.

The output signal $I_x$ of the GM stage is;

$$I_x=a_0+a_1\cdot m(t)\cdot\cos(\omega_0 t)+a_2\cdot[m(t)\cdot\cos(\omega_0 t)]^2$$

$$I_x = a_0 + \frac{1}{2}a_2\cdot m(t)^2 + a_1\cdot m(t)\cdot\cos(\omega_0 t)+\frac{1}{2}a_2\cdot m(t)^2\cdot\cos(2\omega_0 t)$$

where only the DC, linear and $2^{nd}$ order terms are considered. The mixer multiplies this signal and the LO signal, described by a similar polynomial expression to form the output voltage;

$$V_{out}=Ix\cdot\left[b_0+\frac{1}{2}b_2+b_1\cdot\cos(\omega_0 t)+\frac{1}{2}b_2\cdot\cos(2\cdot\omega_0 t)\right]$$

with the following baseband terms $$V_{out(baseband)}=$$
$$\left(a_0+\frac{1}{2}a_2\cdot m(t)^2\right)\cdot\left(b_0+\frac{1}{2}b_2\right)+\frac{1}{2}a_1\cdot b_1\cdot m(t)+\frac{1}{8}a_2\cdot b_2\cdot m(t)^2$$

The $$\frac{1}{2}a_1\cdot b_1\cdot m(t)$$

term is the desired signal term; while, all other components represent unwanted signals that mask the desired signal and thereby lower the SNR of the wanted signal. The unwanted terms also alter the mean value of the output signal making it straightforward to identify and measure these. Because of the multiplicative nature of this transfer function, the reduction of the $b_0$ and $b_2$ coefficients alone will reduce all of the unwanted components. It would therefore be advantageous to have a mixer circuit that minimizes the $b_0$ and $b_2$ coefficients.

The LO switching pair is a differential pair amplifier. In a perfectly balanced differential circuit, the even order distortion components generated by each half-circuit are identical, and therefore, cancel when the output difference signal is formed. For example, $$\Delta v_{out} = v_{out+} - v_{out-}$$

Unfortunately, a perfectly balanced circuit is difficult to realize in practice and any imbalance allows a fraction of the even distortion components to appear in the output difference signal.

The imbalance or lack of symmetry in differential circuits is due to small geometry and doping differences that occur during integrated circuit fabrication. These differences affect device parameters such as the saturation current $I_{sat}$, ideality factor n, forward current gain $\beta$, and parasitic elements in bipolar transistors; and the values of lumped elements such as resistors, capacitors, and inductors. Furthermore, these mismatches change with temperature and operating voltage.

Differential circuits are also impacted by unbalanced input signals, $v_{in+}$ and $v_{in-}$. Phase and amplitude differences drive the half-circuits of the circuit differently, creating even order distortion components that do not cancel completely.

Resistor mismatch is another source of imbalance in differential circuits. A difference in the input bias resistors shifts the operating bias of the input transistors and their intrinsic gain. Any difference in the output resistors alters the composite gain of each half circuit.

An ideal differential-pair amplifier introduces only odd order distortion, whereas all even order distortion is rejected by the circuit topology. As a result, the mean value of the signal remains zero.

An unbalanced differential amplifier, however, cannot completely reject even order distortion and in the case where the differential amplifier is used in a mixer as the LO switching pair, causes non-zero values for the even order coefficients, $b_{2n}$. This has the effect of lowering the overall SNR and altering the mean value of the output signal.

Figure 6:
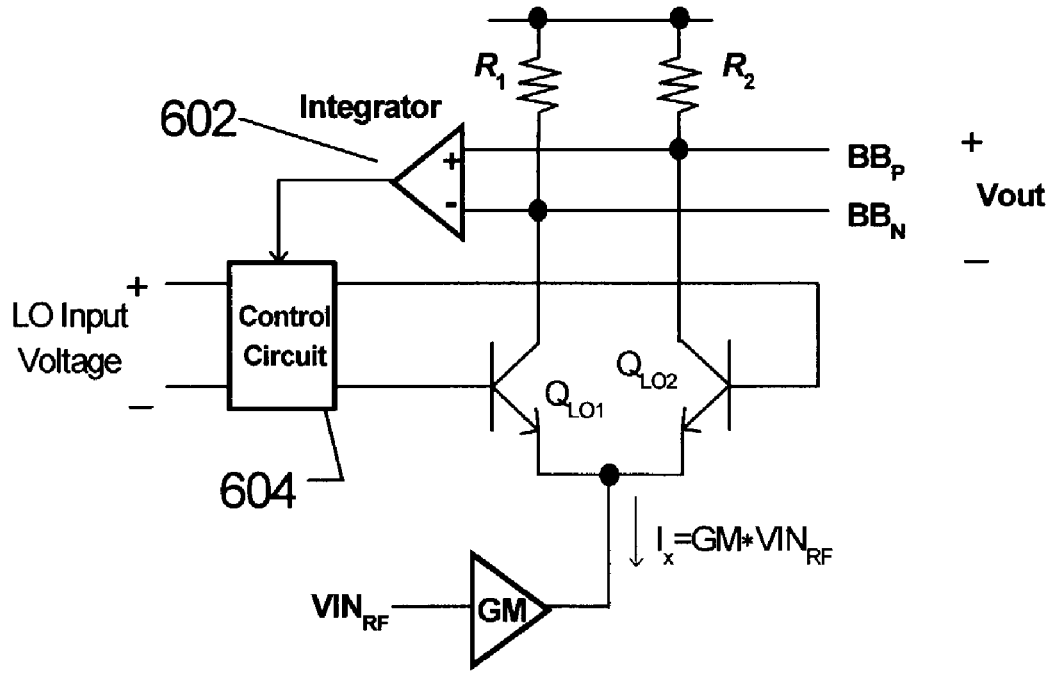
FIG. 6 shows a simplified block diagram of a single balanced mixer circuit with a low-distortion feedback circuit constructed in accordance with the present invention.

FIG. 6 shows a simplified block diagram of a single balanced mixer structure with a feedback circuit constructed in accordance with the present invention. The feedback circuit operates to lower even-order distortion. It does this by improving the symmetry of the LO switching pair, thereby lowering the values for the even order coefficients, $b_{2n}$, and increasing rejection of even-order distortion.

In one embodiment, the feedback circuit comprises an integrator 602 and a control circuit 604 (controller). The feedback circuit separates LO input and output imbalances, adjusting each independently. One reason for independently adjusting each is that a correction signal acting at only the LO input or the output can, in some cases, degrade symmetry. Additionally, the feedback circuit may be further calibrated to achieve even higher performance levels.

Figure 7:
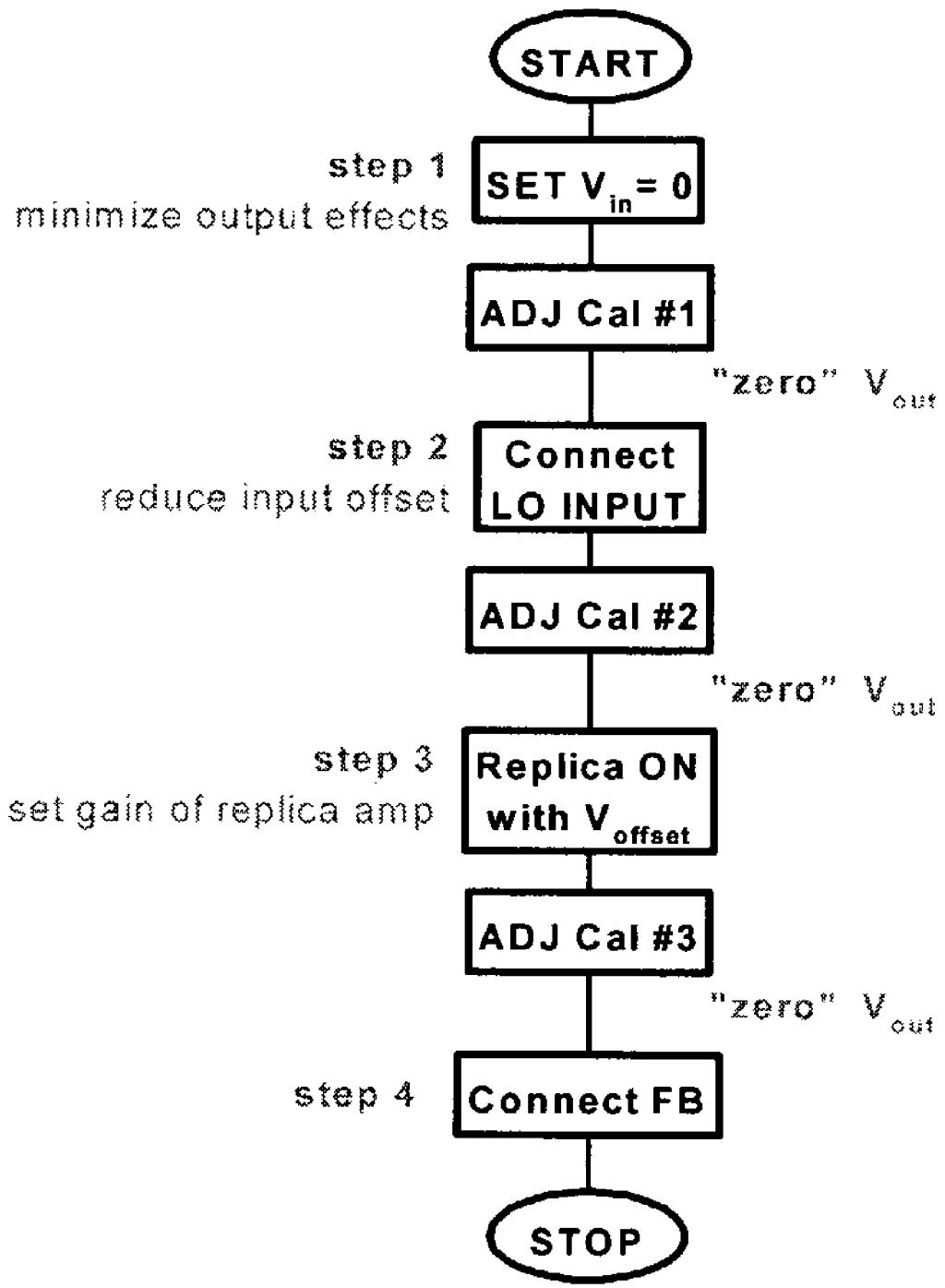
FIG. 7 shows a flow diagram of the calibration steps that may be used to improve the performance of the feedback circuit of FIG. 6 to minimize even order distortion in accordance with the present invention.

FIG. 7 shows a flow graph that illustrates calibration steps that may be followed to improve the performance of the feedback circuit of FIG. 6 to minimize even order distortion in accordance with the present invention. The operation of these calibration steps will be discussed in the following text, with reference to FIG. 8.

Figure 8:
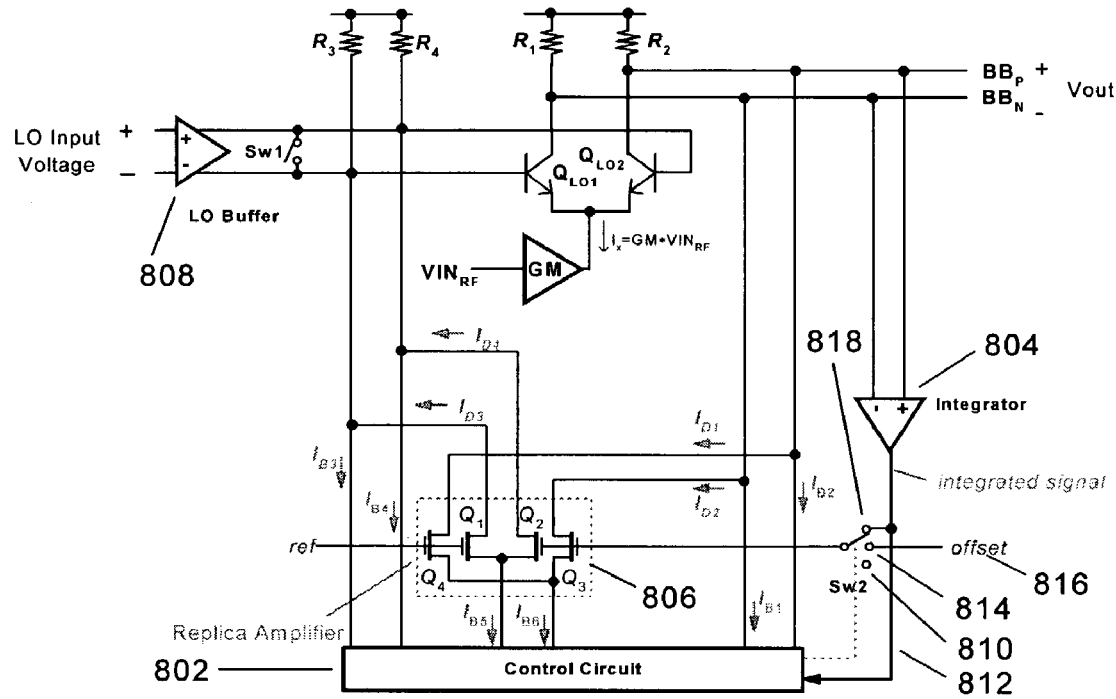
FIG. 8 shows a detailed diagram of one embodiment of a feedback circuit constructed in accordance with the present invention and applied to an LO switching pair of a mixer.

FIG. 8 shows a detailed diagram of one embodiment of a feedback circuit constructed in accordance with the present invention and applied to an LO switching pair ($Q_{LO1}$ and $Q_{LO2}$) of a mixer. The feedback circuit operates to correct the DC offset voltage at the mixer's output using a control circuit 802. One embodiment of the control circuit 802 is described in detail with reference to FIG. 9.

The feedback circuit comprises an integrator 804, the control circuit 802, a replica amplifier 806, and an LO buffer 808. Resistors $R_3$ and $R_4$ are also part of the feedback circuit and could be implemented as actual resistors or as the output resistance of the LO buffer 808 stage. Also included to facilitate calibration are first and second switches (Sw1, Sw2). In one embodiment, the control circuit 802, the replica amplifier 806, the LO buffer 808, the resisters $R_3$, $R_4$, and the switches (Sw1, Sw2) form the control circuit 604 of FIG. 6.

To calibrate the feedback circuit of FIG. 8 to achieve improved performance, step 1 of FIG. 7 is performed as follows. The input $\Delta v_{in}$ is set to zero by closing switch Sw1. The switch Sw2 is set to its lowest tap 810, which opens a portion of the feedback circuit. The integrator 804 measures the output signal $\Delta v_{out}$, and produces an integrated signal 812, that directs the control circuit 802 to drive currents $I_{B1}$ and $I_{B2}$ to reduce the level of the output difference signal, i.e.

$$\Delta v_{out} = I_{B1} R_1 - I_{B2} R_2$$

This minimizes the effects of output resistors, $R_1$ and $R_2$, and ideality factor n mismatches for the bipolar commutating transistors.

Figure 9:
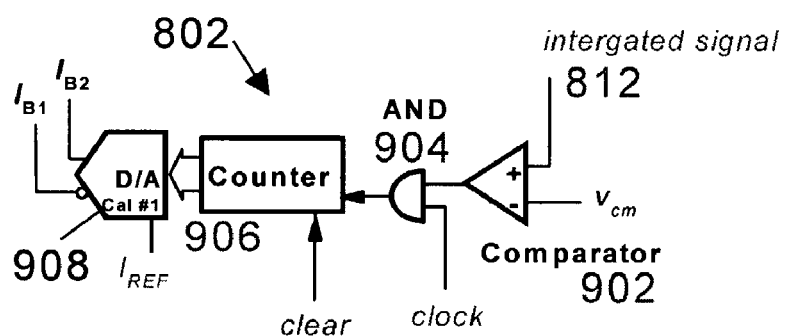
FIG. 9 shows a detailed diagram of a portion of the feedback circuit of FIG. 8 that adjusts the bias currents $I_{B1}$ and $I_{B2}$.

FIG. 9 shows a detailed diagram of a portion of the control circuit 802 that receives the integrated signal 812 that is output from the integrator 804 and adjusts the bias currents $I_{B1}$ and $I_{B2}$. The portion of the control circuit 802 comprises a comparator 902, an AND gate 904, a counter 906, and a digital to analog (D/A) converter 908. The D/A converter 908 is provided with a reference current ($I_{REF}$), and so is able to convert digital values output from the counter 906 into the currents $I_{B1}$ and $I_{B2}$ based on the reference current $I_{REF}$.

Ideally, the output of the integrator 804 should be centered at its common mode level $v_{cm}$. A positive integrated signal (812) output level ($v_{int} > v_{cm}$) indicates the output difference signal from the differential amplifier is positive. Similarly, a negative integrated signal (812) output level ($v_{int} < v_{cm}$) indicates a negative output difference signal. The comparator 902 makes the above determinations.

In one embodiment, a comparator replaces the integrator 804 to provide more accurate calibration settings, since a comparator typically offers higher gain with lower input offset, and thus its output signal may be more accurate than the integrated signal (812) output from the integrator 804.

Initially, the counter 906 is cleared and bias current $I_{B1}$ is maximum while bias current $I_{B2}$ is zero. As such, the output difference signal (Vout) of the differential amplifier will be forced positive. This drives the output of integrator 804 positive, which drives the comparator 902 output positive and allows a clock signal to toggle the counter 906 via the AND gate 904. As the counter 906 value increases, the value of bias current $I_{B2}$ increases and bias current $I_{B1}$ decreases. The clock signal is disabled once the difference signal at the output of the comparator 902 switches negative and the AND gate 904 is disabled. The counter 906 then holds the calibration setting to compensate for the output mismatch effects of the differential amplifier.

Referring again to FIG. 7, step 2 is performed as follows. The switch Sw1 is opened, which allows the LO input to be connected to the differential LO input port. The presence of the LO signal voltage may be needed in some cases in order to calibrate the system in its normal operating mode. The control circuit 802 includes a second circuit (not shown), identical to the circuit that is shown in FIG. 9, and having the integrated signal 812 as its input and the currents $I_{B3}$ and $I_{B4}$ as its outputs. This second circuit operates to adjust the bias currents $I_{B3}$ and $I_{B4}$ which pass through $R_3$ and $R_4$ to generate an offset voltage to compensate for any input offsets, including, but not limited to beta effects and offsets from previous stages, i.e.

$$\Delta v_{out} = \alpha(I_{B3}R_3 - I_{B4}R_4)$$

Once the output of the integrator 804 equals its common mode level, $v_{cm}$, the input offsets are minimized.

Next, step 3 of FIG. 7 is performed as follows. The switch Sw2 is positioned to its center position 814 to connect a DC offset voltage 816 to the circuit so that the gain of the replica amplifier 806 can be adjusted. The offset voltage 816 drives transistors $Q_1$-$Q_4$ of the replica amplifier 806 and steers unequal currents to resistors $R_3$ and $R_4$, resulting in a difference voltage $\Delta v_{in}$ at the input to the differential amplifier expressed as;

$$\Delta v_{in}' = I_{D3}R_3 - I_{D4}R_4$$

The differential amplifier in turn amplifies the difference voltage and produces an output voltage given by $A\Delta v_{in}'$. In parallel, transistors $Q_3$ and $Q_4$ steer currents to resistors $R_1$ and $R_2$ to ideally cancel the effects of the input voltage generated by transistors $Q_1$ and $Q_2$ and resistors $R_3$ and $R_4$.

A third circuit (not shown) is included in the control circuit 802 that is identical to the circuit shown in FIG. 9, and which receives the integrated signal 812 as input and outputs the currents $I_{B5}$ and $I_{B6}$. The integrator 804 measures the output signal and drives current sources $I_{B5}$ and $I_{B6}$, to reduce the output difference signal $\Delta v_{out}$ and thereby achieve the desired cancellation;

$$\Delta v_{out} = I_{D1}R_1 - I_{D2}R_2 \rightarrow A\Delta v_{in}'$$

and sets the gain of feedback circuit so that;

$$\frac{I_{B6}}{I_{B5}} = A\frac{R_3}{R_1}$$

After calibration of the output effects (step #1), the input offset (step #2), and the gain of the replica amplifier 806 (step #3), step 4 of FIG. 7 is performed as follows. The feedback circuit is activated by positioning switch Sw2 to its first tap position 818 to connect the integrated signal 812 to the input of the replica amplifier 806. The integrator 804 operates to monitor the differential mixer output signal and outputs an integrated signal 812 that is an approximation of the output signal's mean value. The integrated signal 812 is connected to the input terminals of transistors $Q_2$ and $Q_3$ and introduces an input offset voltage to the differential LO input port that lowers even order distortion.

Figure 10:
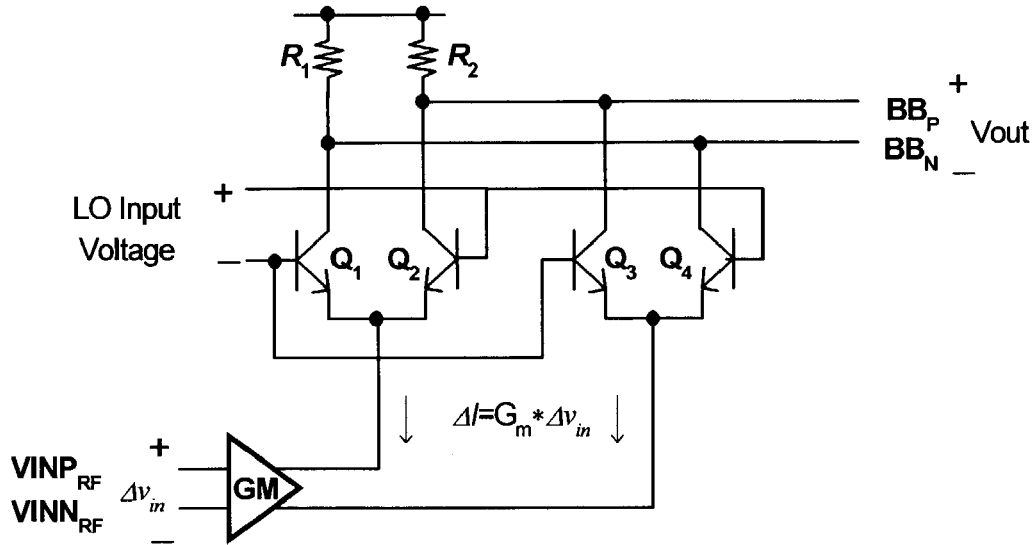
FIG. 10 shows a double balanced mixer circuit diagram.

FIG. 10 shows a double balanced mixer circuit that operates to provide rejection of the LO signal. In the mixer of FIG. 10, each LO differential pair leaks the same level of LO signal current, fortunately however, these currents are opposite and therefore cancel.

The double balanced mixer exhibits the same susceptibility to even order distortion in each of the two LO switching pairs as the single balanced mixer. These effects can be reduced using one or more embodiments of the above feedback circuit that include minor modifications. The modifications allow each LO switching pair to be monitored and adjusted independently.

Figure 11:
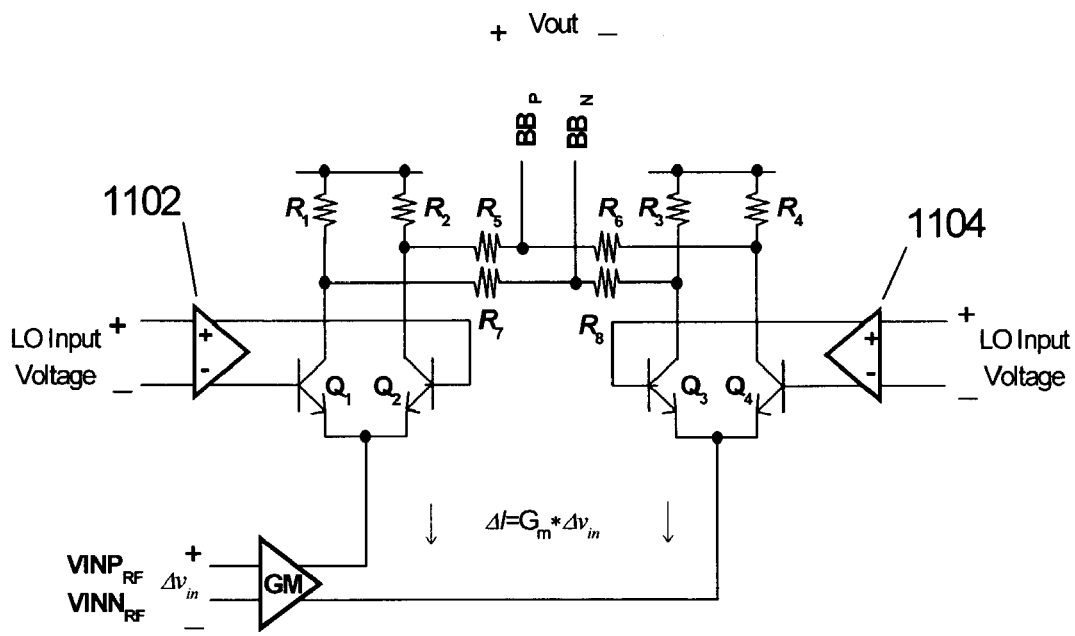
FIG. 11 shows a diagram of a new double balanced mixer circuit constructed in accordance with the present invention.

FIG. 11 shows a diagram of a new double balanced mixer circuit constructed in accordance with the present invention. This circuit operates by summing the voltage outputs of each LO switching pair. In practice, the load resistors $R_1$-$R_4$ of each single balanced mixer are equal. Furthermore, in proper operation of the voltage-summing network, resistors $R_5$-$R_8$, need to be equal and significantly larger than the load resistors. As a result, the output voltage of the new double balanced mixer is;

$$V_{out} = \frac{1}{2}\Delta I_1(R_1 + R_2) + \frac{1}{2}\Delta I_2(R_3 + R_4)$$

The new double balanced mixer comprises two LO buffers (1102 and 1104). These provide isolation and thereby allow each LO pair to be adjusted independently.

Figure 12:
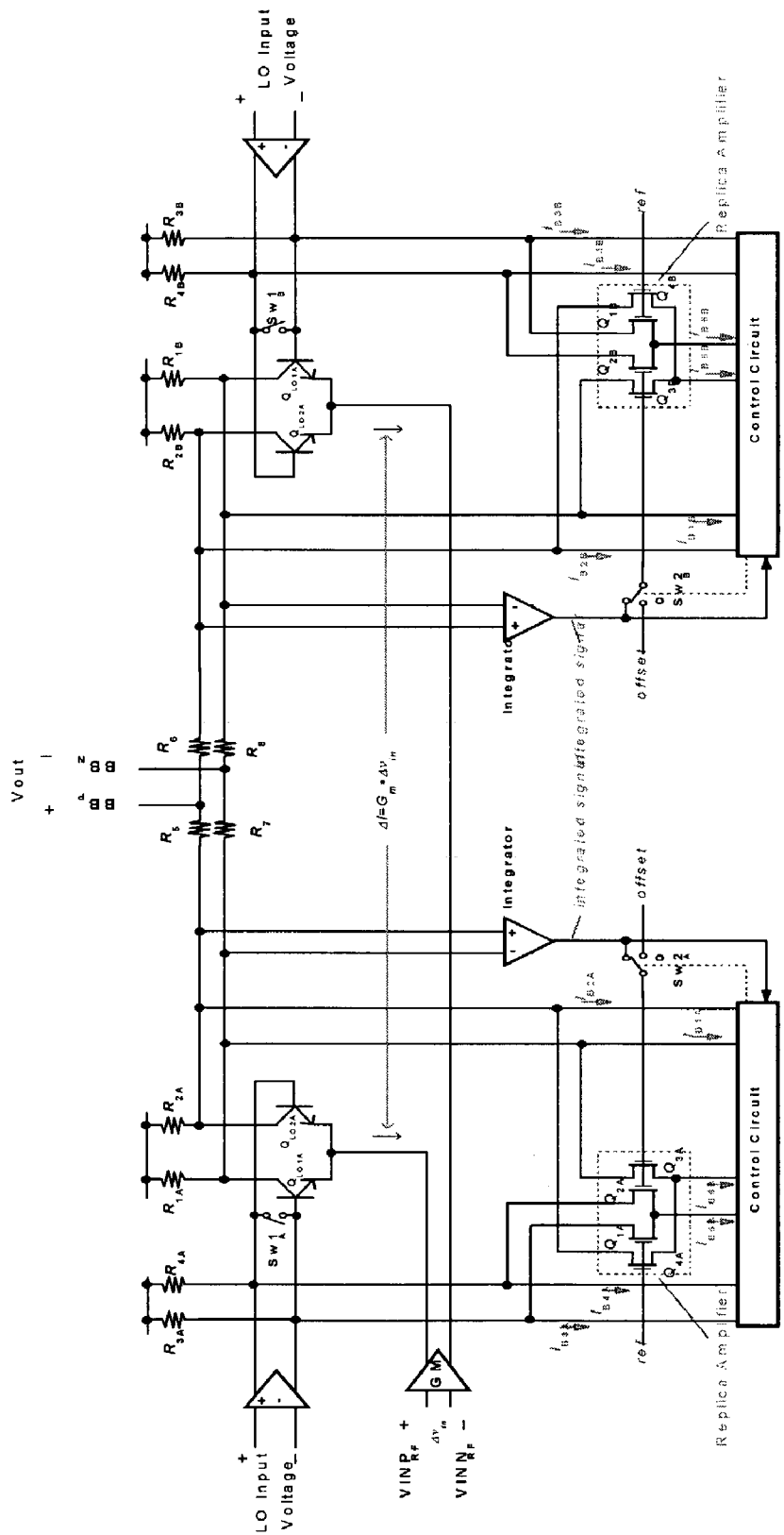
FIG. 12 shows a diagram of the double balanced mixer of FIG. 11 with a feedback system constructed in accordance with the present invention.

FIG. 12 shows a diagram of the double balanced mixer of FIG. 11 with feedback constructed in accordance with the present invention. The circuit can be calibrated with the same calibration sequence as described in FIG. 7 for the single balanced mixer.

In one or more embodiments, a feedback circuit is provided that adjusts the symmetry of a differential LO port of a single balanced mixer by controlling key input and output parameters. A three-step calibration process, using only DC levels, easily corrects for output mismatches, lowers input offset, and sets the gain of the feedback circuit. The resulting feedback loop operates continuously to remove the effects of circuit mismatches, which may change with signal level, temperature, or voltage supply. Furthermore, the embodiments are effective for various types of transistors and are not limited to the specific realizations shown. The feedback technique works well with either single balanced or a novel double balanced mixer topology, which minimizes LO feedthrough.

The present invention includes a differential feedback system that minimizes even order distortion of a mixer circuit. The embodiments described above are illustrative of the present invention and are not intended to limit the scope of the invention to the particular embodiments described. Accordingly, while several embodiments of the invention has been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A direct down-conversion mixer, comprising:
   an LO switching pair coupled to receive an RF input signal and produce a down converted output signal;
   an integrator coupled to receive the output signal and produce an integrator output signal; and
   a control circuit coupled to receive an LO input voltage and the integrator output signal to provide a control signal that is coupled to the LO switching pair so as to offset asymmetry in said LO switching pair, said control circuit comprising a second control circuit coupled to receive the integrator output signal and produce the control signal and a replica amplifier coupled to the second control circuit to receive the control signal.

2. The mixer of claim 1, wherein the control circuit further comprises an LO buffer coupled to the LO switching pair.

3. The mixer of claim 1, wherein the second control circuit comprises:
   a comparator that is coupled to receive the integrator output signal, a reference signal and produce a comparator output signal; and a digital to analog converter that has a digital output coupled to the replica amplifier.

4. The mixer of claim 3, wherein the second control circuit further comprises:
- a gate that receives the comparator output and a clock signal to produce a gate output; and
- a counter that is coupled to receive the gate output and produce a counter output that is coupled to the digital to analog converter.

5. The direct down-conversion mixer of claim 1, wherein the LO switching pair comprises a pair of bipolar junction transistors.

6. The direct down-conversion mixer of claim 1, wherein the LO switching pair comprises a pair of FET transistors.

7. The direct down-conversion mixer of claim 1, wherein said control circuit comprises a feedback circuit disposed to separate an LO input imbalance and an LO output imbalance and separately adjusts said LO input imbalance and said LO output imbalance to increase rejection of even-order distortion.

8. A direct down-conversion double balanced mixer, comprising:
- a first LO switching pair coupled to receive an RF input signal and produce a first down converted output signal;
- a second LO switching pair coupled to receive an RF input signal and produce a second down converted output signal;
- a first integrator coupled to receive the first down converted output signal and produce a first integrator output signal;
- a second integrator coupled to receive the second down converted output signal and produce a second integrator output signal;
- a first control circuit coupled to receive a first LO input voltage and the first integrator output signal to provide a first control signal that is coupled to the first LO switching pair so as to offset asymmetry in said first LO switching pair; and
- a second control circuit coupled to receive a second LO input voltage and the second integrator output signal to produce a second control signal that is coupled to the second LO switching pair.

9. A method of operating a direct down-conversion mixer, comprising:
- receiving an RF signal at an LO switching pair to produce a down converted output signal;
- receiving the output signal at an integrator to produce an integrator output signal; and
- receiving an LO input voltage and the integrator output signal at a control circuit to produce a control signal that is coupled to the LO switching pair so as to offset asymmetry in said LO switching pair; wherein the step of receiving the LO input voltage further comprises receiving the integrator output signal at a second control circuit that produces the control signal and receiving the control signal at a replica amplifier that is coupled to the second control circuit.

10. The method of claim 9 wherein said control circuit separates an LO input imbalance and an LO output imbalance and separately adjusts said LO input imbalance and said LO output imbalance to increase rejection of even-order distortion in said direct down-conversion mixer.

11. A direct down-conversion mixer, comprising:
- an LO switching pair means for receiving an RF input signal to produce a down converted output signal;
- an integrator means for receiving the output signal and producing an integrator output signal; and
- a control circuit means for receiving an LO input voltage and the integrator output signal to produce a control signal that is coupled to the LO switching pair so as to offset asymmetry in said LO switching pair, said control circuit means comprising a second control circuit means for receiving the integrator output signal and producing the control signal and a replica amplifier means coupled to the second control circuit means for receiving the control signal.

12. The mixer of claim 11, wherein the second control circuit means comprises:
- a comparator means for receiving the integrator output signal, a reference signal and producing a comparator output signal; and
- a digital to analog converter means for producing a digital output that is coupled to the replica amplifier means.

13. The mixer of claim 12, wherein the second control circuit further comprises:
- a gate means for receiving the comparator output and a clock signal to produce a gate output; and
- a control means for receiving the gate output and producing a counter output that is coupled to the digital to analog converter.

* * * * *